(12) United States Patent
Rush et al.

(10) Patent No.: US 11,006,549 B2
(45) Date of Patent: May 11, 2021

(54) ADDITIVELY MANUFACTURED COOLING ASSEMBLIES FOR THERMAL AND/OR MECHANICAL SYSTEMS, AND METHODS FOR MANUFACTURING THE ASSEMBLIES

(71) Applicant: General Electric Company, Schenectady, NY (US)

(72) Inventors: Brian Magann Rush, Niskayuna, NY (US); Corey Bourassa, Mechanicville, NY (US); Lana Osusky, Rexford, NY (US); Karthik Bodla, Watervliet, NY (US); Hendrik Pieter Jacobus de Bock, Clifton Park, NY (US); Naveenan Thiagarajan, Niskayuna, NY (US)

(73) Assignee: General Electric Company, Schenectaday, NY (US)

( * ) Notice: Subject to any disclaimer, the term of this patent is extended or adjusted under 35 U.S.C. 154(b) by 82 days.

(21) Appl. No.: 16/271,259

(22) Filed: Feb. 8, 2019

(65) Prior Publication Data
US 2020/0107472 A1    Apr. 2, 2020

Related U.S. Application Data

(60) Provisional application No. 62/739,688, filed on Oct. 1, 2018.

(51) Int. Cl.
| | | |
|---|---|---|
| *F28D 7/00* | (2006.01) |
| *H05K 7/20* | (2006.01) |
| *F28F 1/00* | (2006.01) |
| *F28F 1/40* | (2006.01) |
| *F28F 13/12* | (2006.01) |

(52) U.S. Cl.
CPC ......... *H05K 7/20336* (2013.01); *F28F 1/00* (2013.01); *F28F 1/40* (2013.01); *F28F 13/12* (2013.01)

(58) Field of Classification Search
CPC  H05K 7/20336; F28F 1/00; F28F 1/40; F28F 13/12
USPC ...................................................... 165/80.2
See application file for complete search history.

(56) References Cited

U.S. PATENT DOCUMENTS

| | | | | |
|---|---|---|---|---|
| 2008/0073062 A1* | 3/2008 | Schuette | ............... | H01L 23/427 165/80.4 |
| 2012/0328450 A1* | 12/2012 | Spangler | ................. | F01D 5/187 416/97 R |
| 2017/0364058 A1* | 12/2017 | Jagdale | .............. | G05B 19/4099 |

* cited by examiner

*Primary Examiner* — David D Hwu
(74) *Attorney, Agent, or Firm* — Dinsmore & Shohl LLP

(57) ABSTRACT

A cooling assembly includes a body configured to be placed into thermal contact with a heat source and one or more non-planar, hermetic walls disposed within the body. The one or more non-planar hermetic walls extending around, enclosing, and defining a cooling channel configured to carry cooling fluid through the body such that the cooling fluid contacts internal surfaces of the cooling channel inside the body. The assembly including one or more enhancement structures disposed within the body and coupled with the one or more non-planar hermetic walls. The one or more enhancement structures shaped to change a flow path of the cooling fluid as the cooling fluid moves within the cooling channel and shaped to increase a surface area contacted by the cooling fluid within the cooling channel.

19 Claims, 8 Drawing Sheets

ADDITIVELY MANUFACTURED COOLING ASSEMBLIES FOR THERMAL AND/OR MECHANICAL SYSTEMS, AND METHODS FOR MANUFACTURING THE ASSEMBLIES

CROSS-REFERENCE TO RELATED APPLICATIONS

This application claims priority to U.S. Provisional Application No. 62/739,688, which was filed on 1 Oct. 2018, and the entire disclosure of which is incorporated herein by reference.

FIELD

The subject matter described herein relates to cooling assembly structures made using additive manufacturing.

BACKGROUND

Operation of electronic devices can require thermal management to ensure proper function. As the electronic devices become heated, the devices can suffer from degradation, functional failure, and lower lifespan. For example, the capability of avionics electronics is determined by the computing processing ability of the system. Typically, there are size and weight constraints for an avionics system. These systems are thermally limited such that, for a given volume, only a certain number of cores or processors can operate before thermal issues such as overheating occurs. The processors can be de-rated to avoid overheating in high ambient temperature environments, but at the cost of potentially drastic reductions in processing capability. If the heat can be effectively removed from the system, more processing power, and ultimately more processing capability, may be possible from the same volume and weight.

There are a number of conventional cooling methods such as fans and heatsinks that are currently used to remove heat from the electronic circuitry and maintain the operational temperature range for the electronics. Technological improvements have continued to increase the device density and reduce packaging while also increasing the computing power and functionality such that thermal management systems are a key operational element. In addition, certain applications have restrictions in the size and weight that limit the cooling capacity and therefore limit the processing power and functionality of the electronics.

One example of a known cooling method uses a cold plate to cool heat sources. Some known cold plates are planar metal (e.g., aluminum) bodies formed from two planar halves that enclose a coolant tube (e.g., a copper tube). A liquid flowing in the internal tube of the cold plate cools heat sources that are in contact with the cold plate. This liquid carries heat away from the heat sources to cool the sources. These types of cold plates, however, tend to be heavy and bulky relative to the heat sources, and usually are limited to a planar geometry. As a result, these types of cold plates, and the cooling passages disposed there within may not be useful in environments where weight is a constraining factor (e.g., in aircraft). Additionally, planar cold plates may not be able to effectively carry heat away from heat sources that are not planar.

BRIEF DESCRIPTION

In one or more embodiments, a cooling assembly includes a body configured to be placed into thermal contact with a heat source and one or more non-planar, hermetic walls disposed within the body. The one or more non-planar hermetic walls extending around, enclosing, and defining a cooling channel configured to carry cooling fluid through the body such that the cooling fluid contacts internal surfaces of the cooling channel inside the body. The assembly includes one or more enhancement structures disposed within the body and coupled with the one or more non-planar hermetic walls. The one or more enhancement structures shaped to change a flow path of the cooling fluid as the cooling fluid moves within the cooling channel and shaped to increase a surface area contacted by the cooling fluid within the cooling channel.

In one or more embodiments, a cooling assembly includes a body placed into thermal contact with a heat source, and one or more non-planar, hermetic walls disposed within the body. The one or more non-planar hermetic walls extending around, enclosing, and defining a cooling channel configured to carry cooling fluid through the body such that the cooling fluid contacts internal surfaces of the cooling channel inside the body. The assembly also includes one or more enhancement structures disposed within the body and coupled with the one or more non-planar, hermetic walls. The one or more enhancement structures shaped to change a flow path of the cooling fluid as the cooling fluid moves within the cooling channel and shaped to increase a surface area contacted by the cooling fluid within the cooling channel. The one or more enhancement structures and the one or more non-planar, hermetic walls defining the cooling channel are additively manufactured inside the body.

In one or more embodiments, an additively manufactured cooling assembly includes a body placed into thermal contact with a heat source, and one or more non-planar hermetic walls disposed within the body. The one or more non-planar, hermetic walls extending around, enclosing, and defining a cooling channel configured to carry cooling fluid through the body such that the cooling fluid contacts internal surfaces of the cooling channel inside the body. The assembly also includes one or more enhancement structures disposed within the body and coupled with the one or more non-planar, hermetic walls. The one or more enhancement structures shaped to change a flow path of the cooling fluid as the cooling fluid moves within the cooling channel and shaped to increase a surface area contacted by the cooling fluid within the cooling channel.

BRIEF DESCRIPTION OF THE DRAWINGS

The inventive subject matter may be understood from reading the following description of non-limiting embodiments, with reference to the attached drawings, wherein below.

DETAILED DESCRIPTION

One or more embodiments of the inventive subject matter described herein relates to cooling assemblies or devices that are at least partially additively manufactured. In one embodiment, a multi-function cooling assembly is provided that includes non-planar, hermetic walls disposed inside a body enclosing and defining a cooling channel carrying a cooling fluid through the body. Enhancement structures are disposed within the body and are coupled with the non-planar, hermetic walls to change a flow path of the cooling fluid as the cooling fluid moves within the cooling channel. The enhancement structures are also shaped to increase a surface area contacted by the cooling fluid within the cooling channel.

Figure 1:
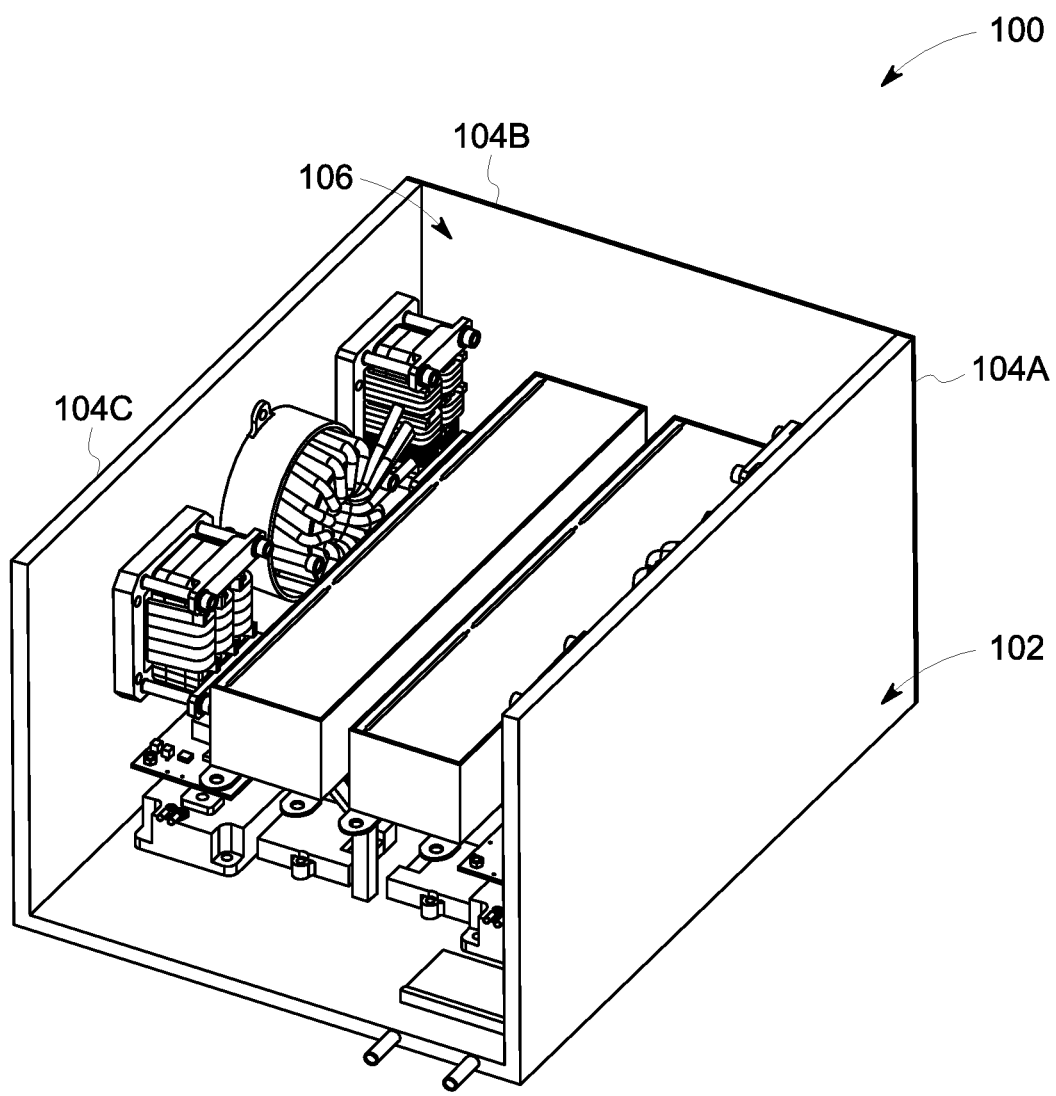
FIG. 1 a perspective partial view of one embodiment of an electrical system.
Figure 2:
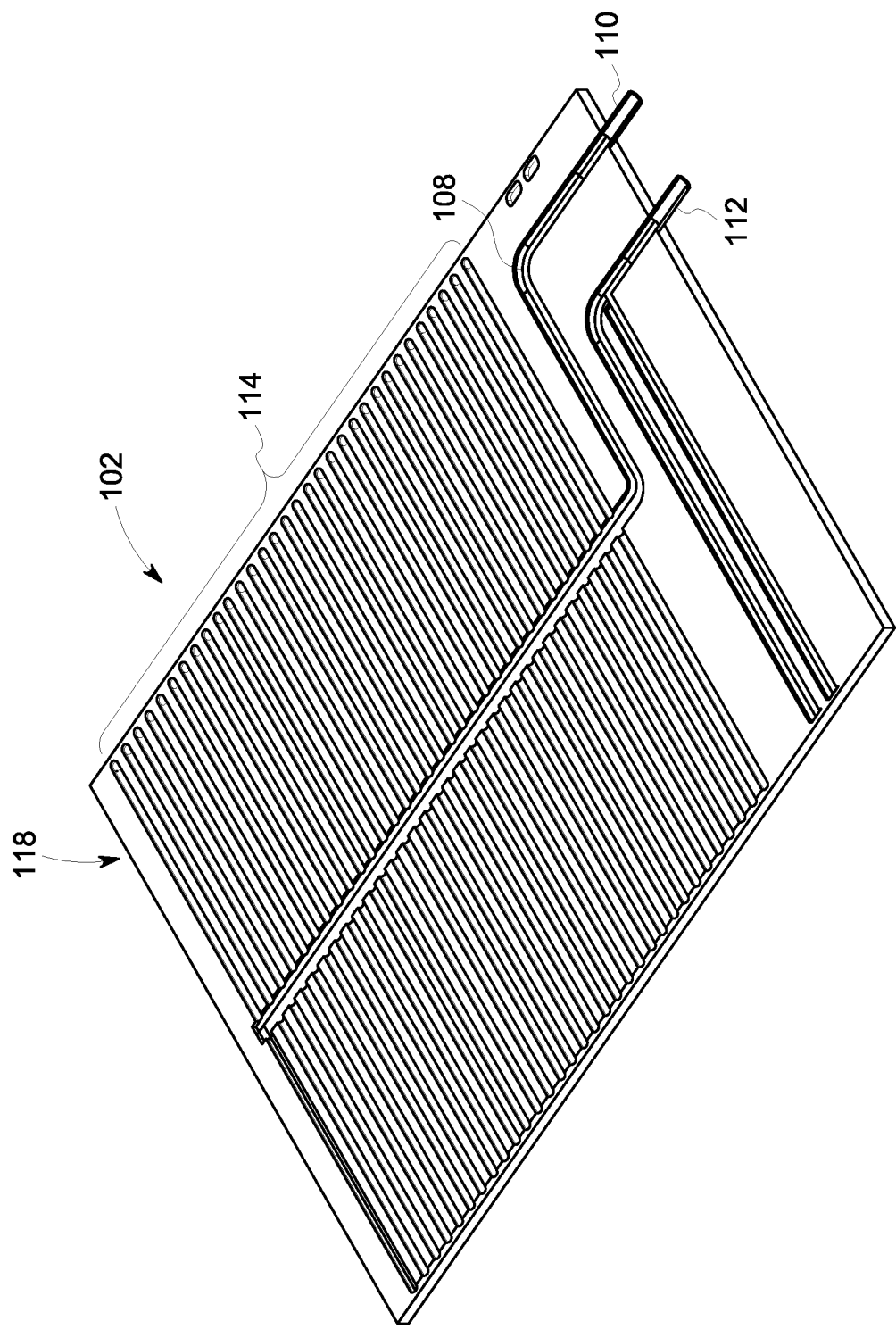
FIG. 2 illustrates a cross-sectional view of a cooling assembly of the electrical system shown in FIG. 1.

FIG. 1 illustrates a perspective partial view of one embodiment of an electrical system 100. FIG. 2 illustrates a cross-sectional view of a cooling assembly 102 that is integrated with the electrical system 100 shown in FIG. 1. The electrical system 100 may be a power converter assembly, such as a computer system including hardware and/or software components, however the electrical system 100 may be any alternative powered system that generates thermal energy. In alternative embodiments, the cooling assembly 102 may be integrated with a turbine engine system, a vehicle system, an alternative electrical system, or the like.

The electrical system 100 includes plural walls 104 that define an interior cavity 106 of the electrical system 100. A top wall and a side wall are removed for illustrative purposes. In the illustrated embodiment, the walls 104 are coupled to form a substantially cubical structure, however, each of the walls 104 may have any alternative planar and/or non-planar orientation.

The electrical system 100 includes the cooling assembly 102 that is integrated and extends within one of the walls 104A of the electrical system 100. For example, the wall 104A of the electrical system 100 may be additively manufactured with the cooling assembly 102 formed inside the wall 104A. The cooling assembly 102 includes a body 118 that is placed into thermal contact with a heat source. For example, the heat source may be one or more components of the electrical system 100 (e.g., computer processors, graphic cards, or the like), may be exhaust from a turbine engine system, or the like. While the cooling assembly 102 is shown as a planar body or object integrated with the wall 104A, one or more surfaces of the wall 104A or the body 118 of the cooling assembly 102 may be a non-planar surface. The cooling assembly 102 may have a variety of any three-dimensional shape, such as curved, cubed, cone shaped, flat with fins or other extensions, or the like. For example, the cooling assembly 102 may have a shape that is substantially common to the shape of the wall 104A, or alternatively the cooling assembly 102 may have a shape that is unique relative to the shape of the wall 104A. Additionally, the cooling assembly 102 may substantially fill the volume of the wall 104A, or may only fill a portion of the wall 104A.

The cooling assembly 102 includes plural planar and/or non-planar, hermetic walls disposed within the body 118 that extend around, enclose, and define a cooling channel 108 disposed within and extending through the body 118. The cooling channel 108 is thermally coupled with the heat source such that the cooling channel 108 carries cooling fluid through the body 118 and absorbs, extracts, or the like, thermal energy from the heat sources.

The cooling channel 108 can be fluidly coupled with external passageways 110, 112 that direct cooling fluid into and out of the cooling assembly 102. The cooling assembly 102 also includes an array of conduits 114 that extend within the wall 104. In the illustrated embodiment, the array of conduits 114 branch out and away from the cooling channel 108 and extend in a vertical direction (not shown). The array of conduits 114 direct the cooling fluid into the vertical wall (not shown) and return the cooling fluid to exit the system via the external passageway 112. In alternative embodiments, the array of conduits 114 may have any shape or size, may have a serpentine configuration such that the conduits 114 include a winding path that extend in one or more orthogonal dimensions within the body 118, or any combination therein. The conduits 114 are fluidly coupled with the cooling channel 108 and direct the cooling fluid to one or more positions within the body 118 of the cooling assembly 102. For example, the conduits 114 may have any pattern, orientation, configuration, or the like, to direct cooling fluid to positions proximate the heat source, and to not direct cooling fluid to positions proximate an alternative electrical component that is not a heat source.

The conduits 114 form a channel through which the cooling fluid flows within the cooling assembly 102 to direct the cooling fluid toward different heat sources within the electrical system 100. Additionally or alternatively, the conduits 114 may be designed to control the pressure and/or a pressure drop as a result of the cooling fluid flowing within the cooling assembly 102, may include varying channel cross-sectional shapes and sizes, may extend in two or more different directions, form two or more different arrays of conduits, or the like. For example, the geometry shape and size of each individual channel within the array of conduits 114 may be common or unique relative to each other channel to control the flow rate of the fluid within the body 118.

In one or more embodiments, the body 118 may include two or more separate cooling channels 108 that direct cooling fluid through the body 118 of the cooling assembly 102. For example, a first cooling channel may direct cooling fluid toward a first portion of the body 118, and a second cooling channel, that may be fluidly separate from or fluidly coupled with the first cooling channel, and may direct cooling fluid toward a second portion of the body 118. Optionally, the first and second cooling channels may be fluidly coupled via one or more conduits (e.g., an array of conduits) extending therebetween the first and second cooling channels. In alternative embodiments, the two or more separate cooling channels 108 may accommodate the flow of different cooling fluids within the body 118. For example, the first and second cooling channels may be fluidly separate or distinct from each other such that a first fluid flows or moves within the first cooling channel and a different fluid flows or moves within the second cooling channel.

In one or more embodiments, the interior cavity 106 may be formed by stamping and forming a single piece or material, or by coupling two or more components together to form the interior cavity 106. For example, the wall 104 including the cooling assembly 102 may be additively manufactured, and may subsequently be coupled with the other walls 104 of the electrical system 100. Optionally, the cooling assembly 102 may be additively manufactured with two or more walls 104 such that the cooling assembly 102 extends through two or more walls 104 of the electrical system 100 to direct the cooling fluid toward different heat sources of the electrical system.

As a result of exposure to thermal energy from the heat source, the cooling fluid absorbs or extracts thermal energy. In one or more embodiments, at least a portion of the cooling fluid changes phase from liquid to a vapor or gas. For example, the cooling fluid may change from a first single phase (e.g., liquid) to a second single phase (e.g., gas or vapor) or to a multiphase (e.g., liquid and gas mix). Optionally, the cooling fluid may remain in the liquid phase but the temperature of the cooling fluid may be increased relative to the cooling fluid not exposed to the thermal energy from the heat source (e.g., the temperature of the cooling fluid flowing into the passageway 110).

The cooling assembly 102 also includes enhancement structures (detailed below with reference to FIGS. 3 through 7), that may promote the transfer of thermal energy from the heat source (e.g., one or more components within the cavity 106 of the electrical system 100) to the cooling fluid within the cooling assembly 102. For example, the enhancement structures may be porous wick structures or lining along one or more inner surfaces of a portion of the cooling channel 108. The enhancement structures also change a flow path of the cooling fluid as the cooling fluid moves within the cooling channel 108 and increase a surface area contacted by the cooling fluid within the cooling channel 108. The enhancement structures may be surface area enhancement structures or thermal energy enhancement structures. For example, the enhancement structures may change a surface area of the cooling channel to change a characteristic of the fluid moving within the channel (e.g., flow rate, turbulence, or the like) and/or the enhancement structures may change the surface of the cooling channel to change a thermal characteristic about the fluid (e.g., to promote bubbling or boiling, to increase an amount of thermal energy extracted from the fluid, or the like). The enhancement structures may promote the transfer of thermal energy from the heat sources, may change the surface area or a roughness of the surface area of the cooling channel 108 to promote bubbling or boiling of the cooling fluid in the liquid phase, may separate the multiphase liquid and gas mixture of the cooling fluid within the cooling channel 108, or the like. The enhancement structure may be varying fluid channel size or location, expanding and contracting channel diameters to accommodate the production of vapor or gas phase of the cooling fluid, may be surface features such as fins to promote boiling or bubbling of the fluid, may be integrated swirling features to vortex the multiphase liquid and vapor mixture to separate the liquid from the vapor, or the like. The enhancement structures will be described in further detail below.

The enhancement structures and the walls defining and enclosing the cooling channel 108 and the array of conduits 114 are manufactured additively. For example, additively manufacturing the cooling assembly 102 allows for the cooling assembly 102 to have any three-dimensional shape, include multiple fluidly separate domain cooling techniques within the same body 118, or the like. Additive manufacturing can involve joining or solidifying materials under computer control to create a three-dimensional object, such as by adding liquid molecules or fusing powder grains with each other. Examples of additive manufacturing include, but are not limited to, three-dimensional (3D) printing, rapid prototyping (RP), direct digital manufacturing (DDM), selective laser melting (SLM), electron beam melting (EBM), direct metal laser melting (DMLM), or the like. Alternatively, the cooling assembly 102 can be formed in another manner.

Figure 3:
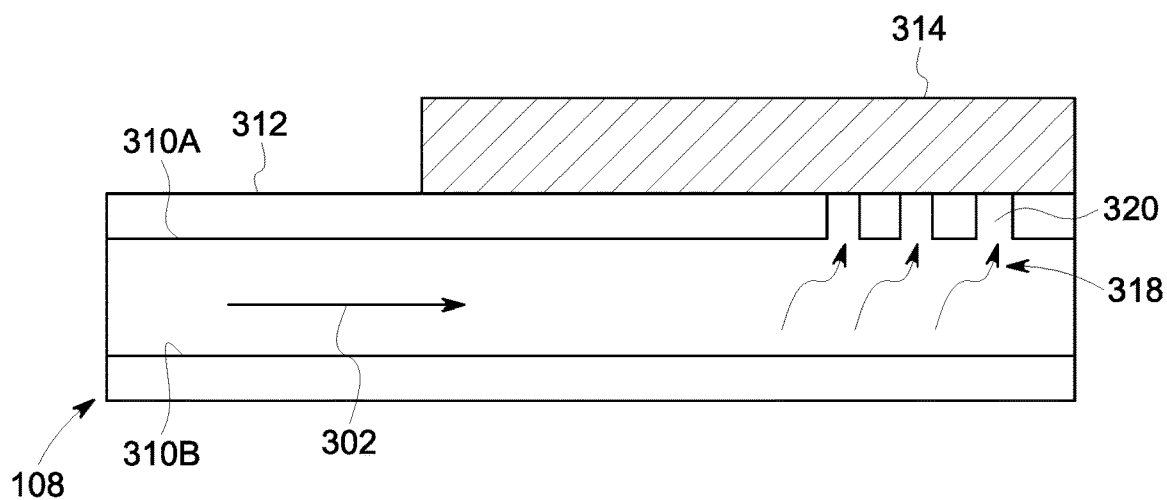
FIG. 3 illustrates an enhancement structure of the cooling assembly shown in FIG. 2.

FIG. 3 illustrates one embodiment of an enhancement structure 318 of the cooling assembly 102. The cooling channel 108 includes inner surfaces 310A, 310B that define and enclose the cooling channel 108. In the illustrated embodiment, the inner surfaces 310A, 310B are substantially planar, however one or more of the walls may be non-planar surfaces. The cooling channel 108 directs the cooling fluid 302 toward a heat source 314 (e.g., computer processors, graphic cards, or the like). The heat source 314 is coupled with an exterior or outer surface 312 of the cooling channel 108. Optionally, the heat source 314 may be disposed proximate to, but separate from the outer surface 312.

The enhancement structure 318 includes plural channels 320 that direct cooling fluid 302 toward the heat source 314. In one embodiment, the channels 320 are jet impingement holes that direct the cooling fluid 302 out of the cooling channel 108 and into a cavity or volume (not shown) that extends along the inner surface 310A of the cooling channel 108. Return passages (not shown) may subsequently direct the heated cooling fluid 302 back to the cooling channel 108. Optionally, the enhancement structure 318 may include any number of channels 320 having common and/or unique shapes, sizes, and orientations relative to each other channel 320 to promote the exchange of thermal energy from the heat source 314 to the cooling fluid.

Returning to FIGS. 1 and 2, the cooling assembly 102 with the cooling channel 108 and enhancement structure 318 is manufactured additively within the wall 104A of the electrical system 100. Additively manufacturing the cooling assembly 102 allows for the cooling assembly 102 to improve the reduction of weight and volume of the electrical system 100 relative to a non-additively manufactured cold plate or cold plate assembly that may be coupled with the electrical system 100. For example, integration of the cooling channel 108 within the walls 104 of the system 100 by additive manufacturing eliminates the use or need of separate heat sinks. Additionally, the cooling assembly 102 can have different three-dimensional shapes and/or have multi-domain cooling techniques that may improve the transfer of thermal energy from the heat source relative to the non-additively manufactured cold plate assemblies.

Figure 4:
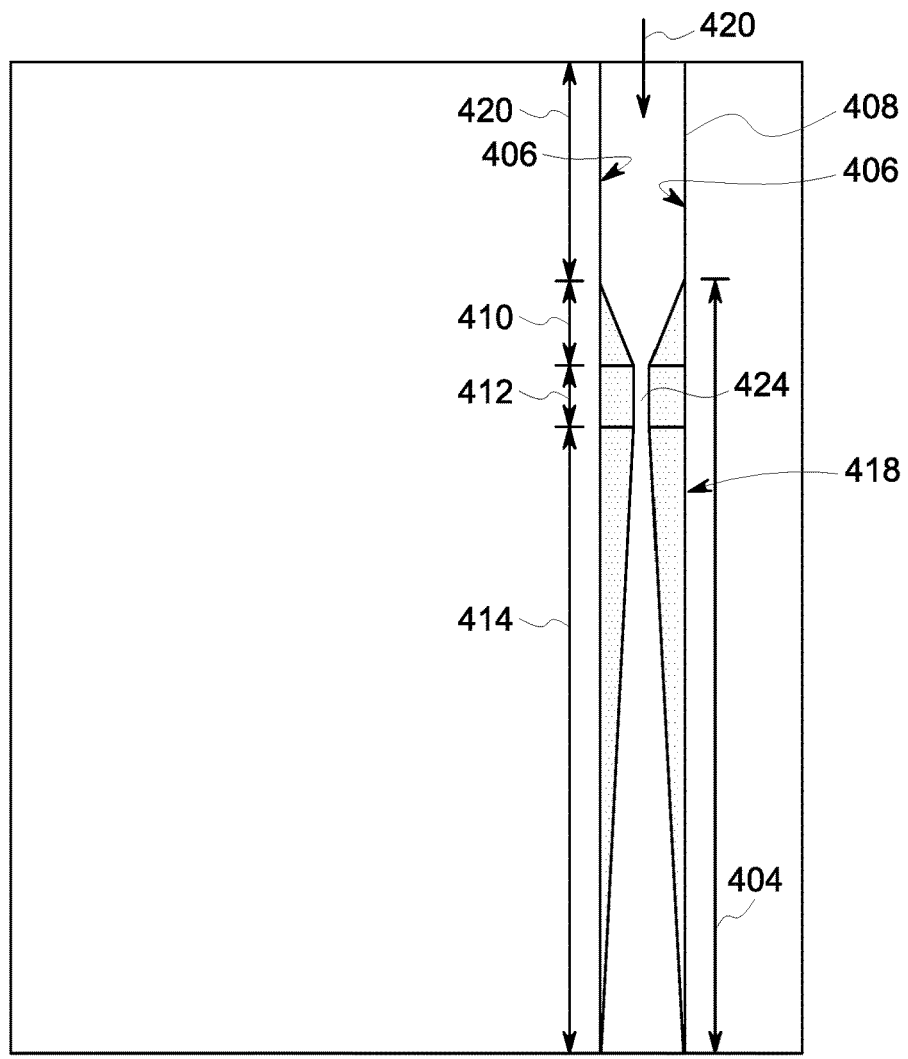
FIG. 4 illustrates one embodiment of an enhancement structure.

FIG. 4 illustrates one embodiment of an enhancement structure 418 disposed within a cooling assembly and coupled with walls 406 of a cooling channel 408. In the illustrated embodiment, the walls 406 are substantially planar walls, however one or more may be non-planar walls. The hermetic walls 406 extend around, enclose, and define the cooling channel 408. The enhancement structure 418 may be additively manufactured and integrated with the cooling system 102, the cooling channel 108, or one or the conduits 114 of FIGS. 1 and 2, or the like. Cooling fluid may flow through the cooling channel 408 in the direction 420. In the illustrated embodiment, the enhancement structure 418 is a protrusion that extends away from an inner surface of the walls 406 of the cooling channel 408 and into the cooling channel 408. The enhancement structure 418 extends a length 404 within the cooling channel 408.

The enhancement structure 418 includes a first section 410 in the direction of flow 420 of the cooling fluid. A diameter of the cooling channel 408 decreases within the first section 410. The cooling fluid subsequently flows through a second section 412 of the cooling channel 408. The cooling channel 408 has a substantially constant diameter within the second section 412. The cooling fluid subsequently flows out of the second section 412 and into a third section 414. The diameter of the cooling channel 408 increases within the third section 414. In alternative embodiments, the first, second, and third sections 410, 412, 414 may extend common or different varying lengths within the cooling channel 408, may have varying sizes extending into the cooling channel 408 and away from the surfaces of the walls 406, or the like. The enhancement structure 418 may be shaped and sized to control a pressure of the cooling fluid (e.g., tune a pressure drop of the fluid) within the cooling channel 408.

The enhancement structure changes the surface area of cooling channel 408 and, as a result, changes one or more properties of the flow of the cooling fluid within the cooling channel 408. For example, the enhancement structure may be shaped, sized, and oriented to change the flow rate of the fluid, the temperature of the fluid, the turbulence of the fluid, the pressure of the fluid, or the like. The enhancement structure 418 that protrudes away from the surfaces of the walls 406 of the cooling channel 408 and decreases the diameter and increases the diameter of the cooling channel 408 within the first and third sections 410, 414, respectively, locally changes the temperature of the cooling fluid. For example, as the diameter of the cooling channel 408 decreases in the first section 410, the temperature of the cooling fluid increases as the cooling fluid is compressed. Additionally, as the diameter of the cooling channel 408 increases in the third section 414, the temperature of the cooling fluid decreases as the cooling fluid is decompressed. In one or more embodiments, a cooler or cooling system 424 may be coupled with the cooling channel 408 and/or coupled with the enhancement structure 418 proximate the second section 412. The cooling system 424 extracts thermal energy from the cooling fluid. The cooling system 424 may be a fan, a secondary cooling or conduit loop, a thermoelectric cooler, or the like.

Figure 5:
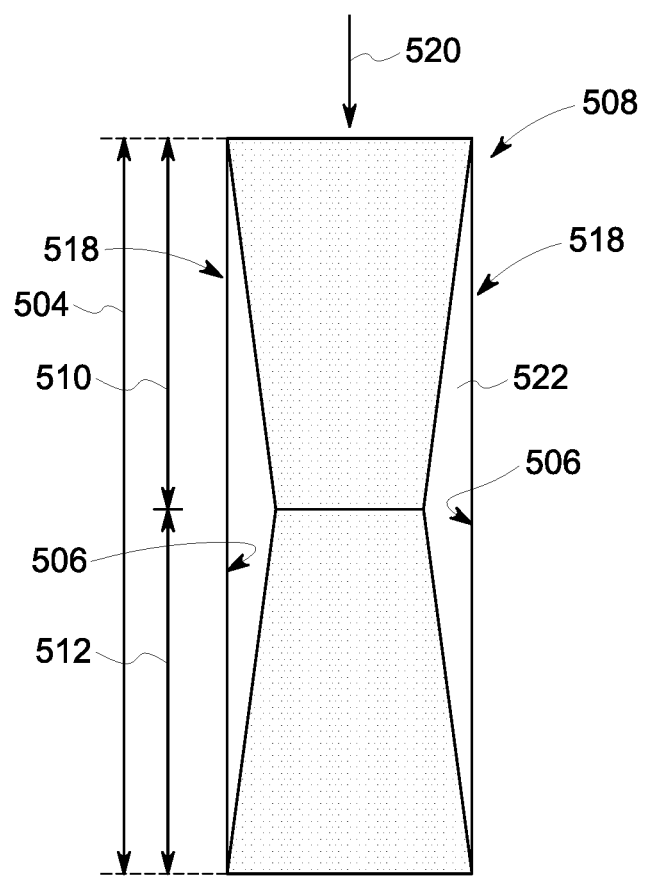
FIG. 5 illustrates another embodiment of an enhancement structure.

In one or more embodiments, the enhancement structure may be shaped and sized to accommodate a multiphase cooling fluid (e.g., a liquid and a vapor mixture). For example, FIG. 5 illustrates another example of an enhancement structure 518. The enhancement structure 518 is coupled with inner surfaces of walls 506 that extend around, enclose, and define a cooling channel 508 and includes a protrusion 522 that protrudes a distance away from the inner surface of the walls 506 of a cooling channel 508 and into the cooling channel 508. For example, the enhancement structure 518 is additively manufactured within the cooling channel 508 through which cooling fluid flows in a direction 520. In the illustrated embodiment, the enhancement structure 518 extends around a perimeter of the cooling channel 508 and the protrusions 522 extend a distance away from the inner surface of the wall 506 of the tubular cooling channel 508. Optionally, the enhancement structure 518 may extend around a portion of the perimeter of the cooling channel 508, may include two or more separate protrusions 522 that are coupled with different inner surfaces of the cooling channel 508 that may have common or unique shapes and/or sizes relative to each other protrusion 522, or any combination therein.

The enhancement structure 518 extends a length 504 along the length of the cooling channel, however the structure 518 may extend any length. The enhancement structure 518 increasingly reduces the diameter of the cooling channel within a first section 510, and subsequently increasingly increases the diameter of the cooling channel 508 within a second section 512. Optionally, the enhancement structure 518 may also include a subsequent third section (not shown), that may increasingly decrease the diameter of the cooling channel 508, may have a substantially constant shape such that the diameter of the cooling channel 508 does not substantially increase or decrease, or the like.

The enhancement structure 518 is shaped and sized to accommodate a multiphase cooling fluid within the cooling channel 508. For example, the enhancement structure 518 may separate and trap the vapor phase of the cooling fluid and allow the liquid phase of the cooling fluid to flow through the cooling channel 508. Optionally, the enhancement structure 518 may be shaped and sized to control or tune a pressure drop of the cooling fluid within the cooling channel 508. Optionally, the enhancement structure 518 may enable localized multiphase fluid to flow in some areas of the conduit (e.g., the liquid and vapor mixture may flow in a first area of the conduit) and may promote single phase fluid to flow in other areas of the conduit (e.g., the cooling fluid of the liquid phase or the vapor phase).

Figure 6:
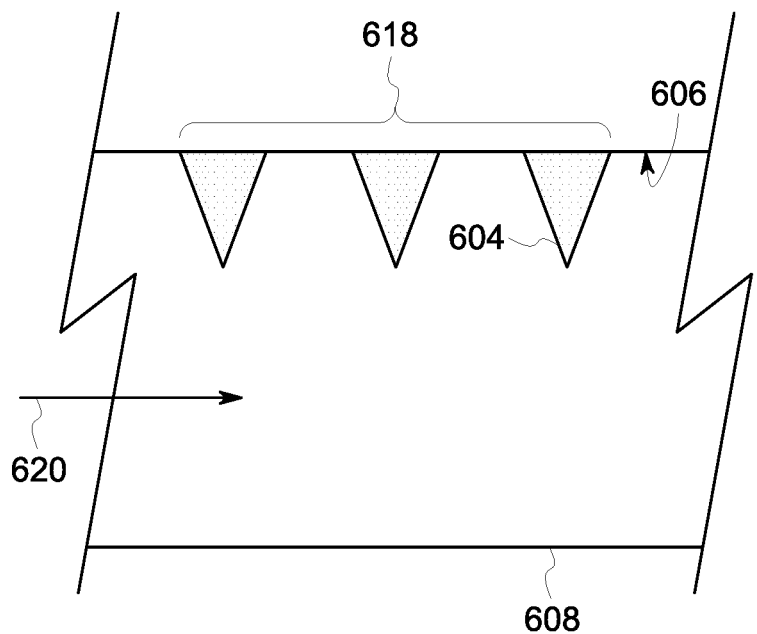
FIG. 6 illustrates another embodiment of an enhancement structure.

FIG. 6 illustrates another embodiment of an enhancement structure 618 additively manufactured within a cooling channel 608. The enhancement structure 618 includes an array of protrusions 604 that are additively manufactured within the cooling channel 608. The protrusions 604 or notches extend a distance away from an inner surface of a wall 606 of the cooling channel 608. In the illustrated embodiment, the protrusions 604 are coupled with the inner surface of the wall 606 of the cooling channel 608, however plural protrusions 604 may be coupled with and extend from any surface or surfaces of the cooling channel 608 about a center axis of the cooling channel 608. Optionally, the protrusions 604 may have any alternative common or unique shapes and/or sizes. The protrusions 604 of the enhancement structure 618 change the flow path of the cooling fluid as the cooling fluid moves within the cooling channel 608. Additionally, the enhancement structure 618 changes a surface area contacted by the cooling fluid within the cooling channel 608. The protrusions 604 may have any patterned or random configuration within the cooling channel 608 to change one or more properties of the cooling fluid flowing in a direction 620 within the cooling channel 608. For example, the protrusions 604 may form or create nucleation sites to promote bubbling or boiling of the cooling fluid.

Figure 7:
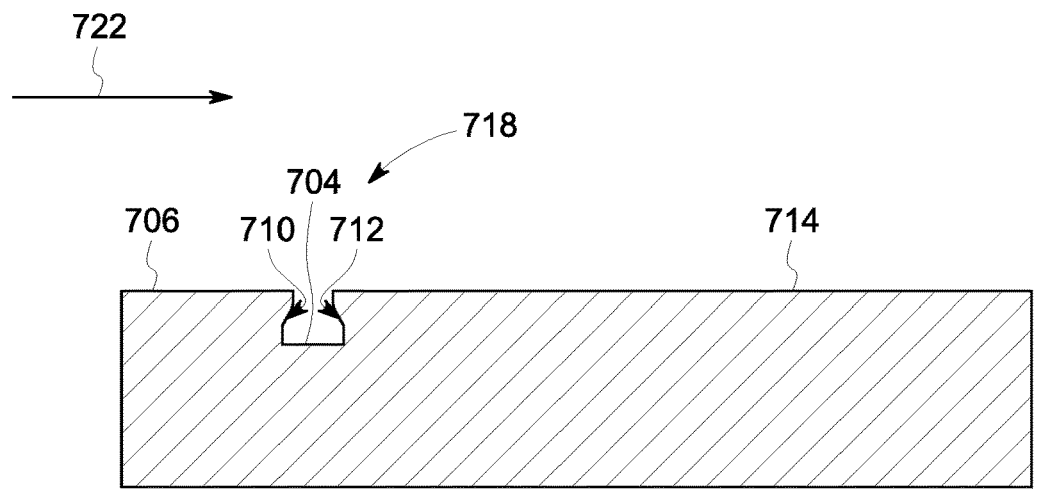
FIG. 7 illustrates another embodiment of an enhancement structure.

FIG. 7 illustrates another embodiment of an enhancement structure 718. The enhancement structure 718 includes a cavity 704 that is embedded within and extends away from a surface 706 of a heat source 714, such as an electronic chip or heat spreader. The cavity 704 includes reentrant walls 710, 712 that extend a distance away from the surface 706. The cavity 704 is shaped and sized to increase the reduction of temperature overshoot at nucleation of the cooling fluid. For example, the cavity 704 traps the vapor phase of the cooling fluid that flows in a direction 722 along the surface 706 of the heat source 714 and does not trap the liquid phase of the cooling fluid of a multiphase cooling fluid that flows proximate to the enhancement structure 718. The cavity 704 separates the liquid phase from the vapor or gas phase. In the illustrated embodiment, the cavity 714 of the enhancement structure 718 has a substantially pyramidal shape, however the cavity 714 may have any alternative shape such as triangular, polyhedral with multiple corners, or the like. Optionally, the cavity 704 may include more than four or less than four corners, may have any alternative shape and/or size, may include plural cavities in an array or other patterned or random configuration, or the like.

Figure 8:
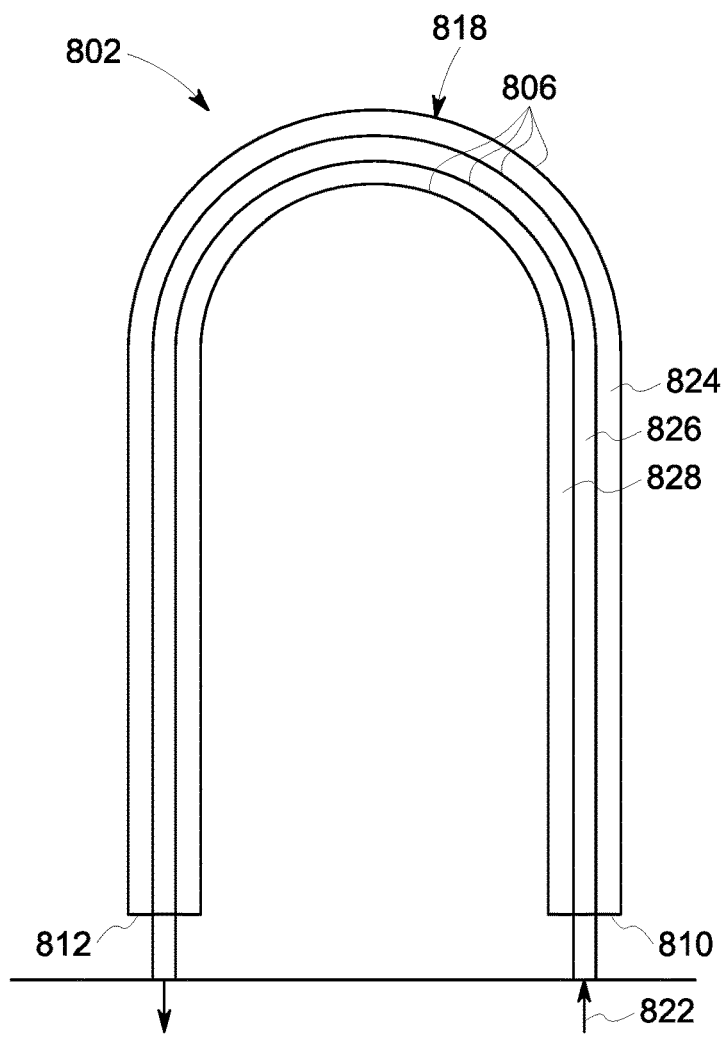
FIG. 8 illustrates a top view of one embodiment of conduits of a cooling system.

FIG. 8 illustrates a top view of one embodiment of a cooling assembly 802. The cooling assembly 802 includes a body 818 having plural non-planar, hermetic walls 806 disposed within the body 818. The walls 806 extend around, enclose, and define cooling channels 824, 826, 828 that carry cooling fluid through the body 818. The cooling assembly 802 may be additively manufactured within a wall, surface, component, or the like, of the electrical system (shown in FIG. 1), within a component of a turbine engine system, or the like. In the illustrated embodiment, the cooling assembly 802 includes three cooling channels 824, 826, 828 that are fluidly separate and distinct channels or passages through which the cooling fluid flows in a direction 822 into an inlet passageway 810 and out of the cooling assembly 802 via an outlet passageway 812. The cooling channels 824, 826, 828 are shown having a U-shaped configuration, however one or more of the cooling channels 824, 826, 828 may extend in any three-dimensional direction that is common or unique to the direction of each other cooling channel.

Figure 9:
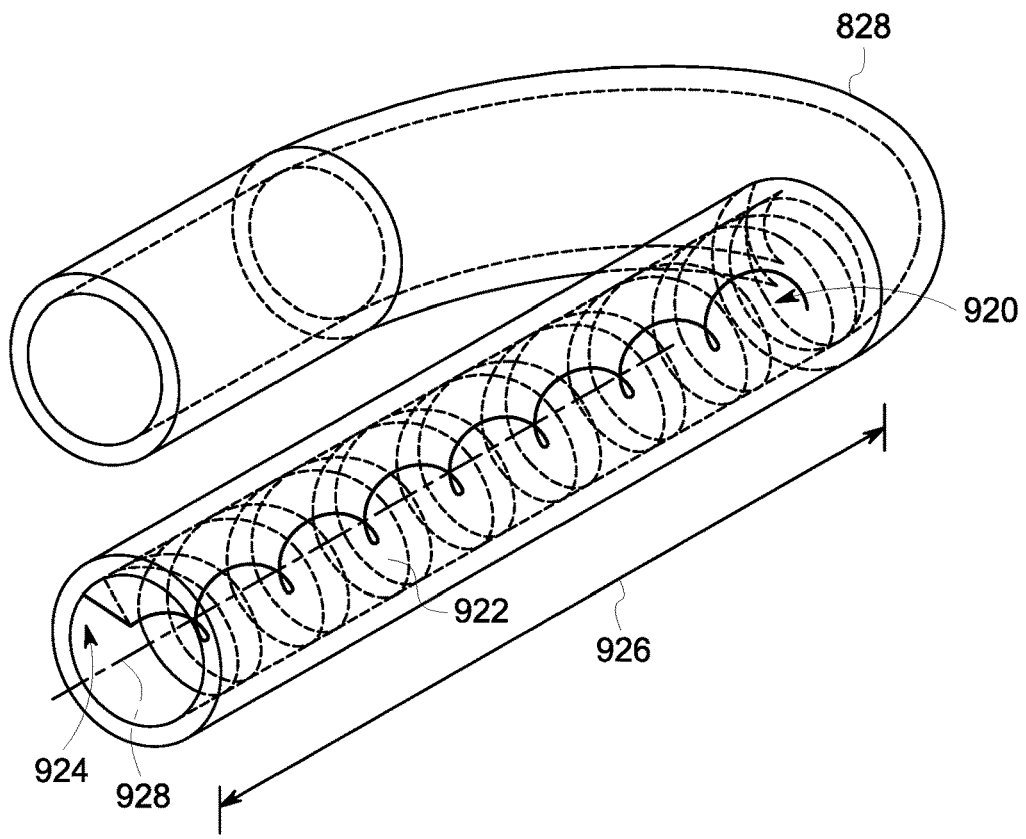
FIG. 9 illustrates a cross-sectional view of one embodiment of an enhancement structure of one of the conduits shown in FIG. 8.
Figure 10:
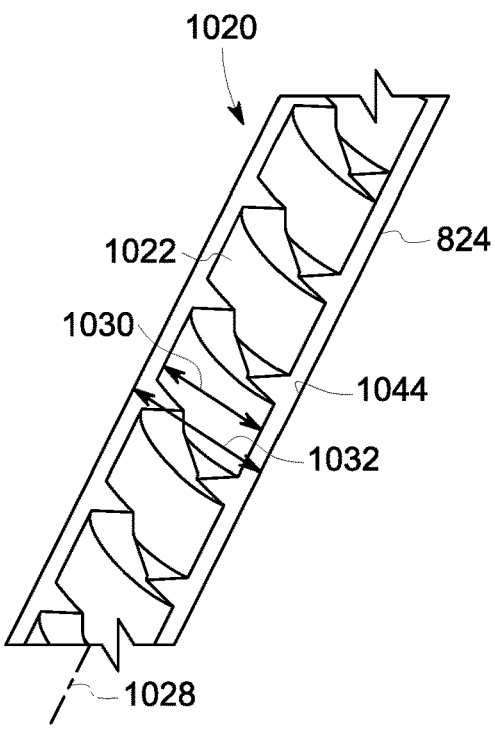
FIG. 10 illustrates a cross-sectional view of one embodiment of another enhancement structure of one of the conduits shown in FIG. 8.

The cooling assembly 802 includes enhancement structures that are disposed within the cooling channels (shown in FIGS. 9 and 10). The enhancement structures are additively manufactured with the cooling channels and may have any three-dimensional shape. FIG. 9 illustrates a cross-sectional view of an enhancement structure 920 of the cooling channel 828. The enhancement structure 920 includes a spiral protrusion 922 that wraps helically within an inner surface 924 of the cooling channel 828. In the illustrated embodiment, the spiral protrusion 922 includes plural protrusions, and each protrusion is disposed substantially equidistant from each other protrusion along a length 926. Optionally, the spiral protrusion 922 may include any number of helically wrapped spirals that may be spaced any uniform and/or non-uniform distances apart from each other. Additionally, in the illustrated embodiment, each spiral is coupled with and extends a distance away from the inner surface 924 of the cooling channel 828 and in a direction towards a center axis 928 of the cooling channel 828. In one or more embodiments, each spiral may extend a uniform or non-uniform distance away from the inner surface 924. Optionally, one or more of the spirals may be coupled with the inner surface 924, and one or more other spirals may not be coupled with the inner surface 924. The additively manufactured spiral protrusion 922 may have any three-dimensional shape, size, orientation, or the like, within the cooling channel 828, may be coupled with the cooling channel 828 at any one or more positions within the cooling channel 828, or the like.

The cooling fluid moves by rotating as the cooling fluid flows through the spiral protrusion 922. The rotation force moves the liquid phase of the multiphase cooling fluid in a direction toward the inner surface 924 of the cooling channel 828 (e.g., away from the center axis 928) and moves the gas or vapor phase of the multiphase cooling fluid in a direction toward the center axis 928. For example, the spiral protrusion 922 separates the liquid phase of the cooling fluid from the vapor or gas phase of the cooling fluid. The liquid phase of the cooling fluid that flows proximate the inner surface 924 may extract thermal energy from a heat source (not shown) outside of the cooling channel 828. In one or more embodiments, the cooling fluid may be a single phase (e.g., liquid phase) cooling fluid. The spiral protrusion 922 increases the surface area over which the cooling fluid flows and may improve the transfer of thermal energy from a heat source.

FIG. 10 illustrates a cross-sectional view of the enhancement structure 1020 of the cooling channel 824. Like the enhancement structure 920 of FIG. 9, the enhancement structure 1020 includes a spiral protrusion 1022 that is helically wrapped around a center axis 1028 of the cooling channel 824. One difference between the enhancement structures 920, 1020 is that the enhancement structure 1020 has an outer diameter 1030 that is smaller than an inner diameter 1032 of the cooling channel 824. For example, the cooling fluid may flow along the surface of each of the spiral protrusions 1022 and/or along an inner surface 1044 of the cooling channel 824. Like the enhancement structure 920, the rotation force of the cooling fluid caused by the enhancement structure 1020 moves the liquid phase of the multiphase cooling fluid in a direction toward the inner surface 1044 of the cooling channel 824 (e.g., away from the center axis 1028) and moves the gas or vapor phase of the multiphase cooling fluid in a direction toward the center axis 1028. For example, the spiral protrusion 1022 separates the liquid phase of the cooling fluid from the vapor phase of the cooling fluid.

Figure 11:
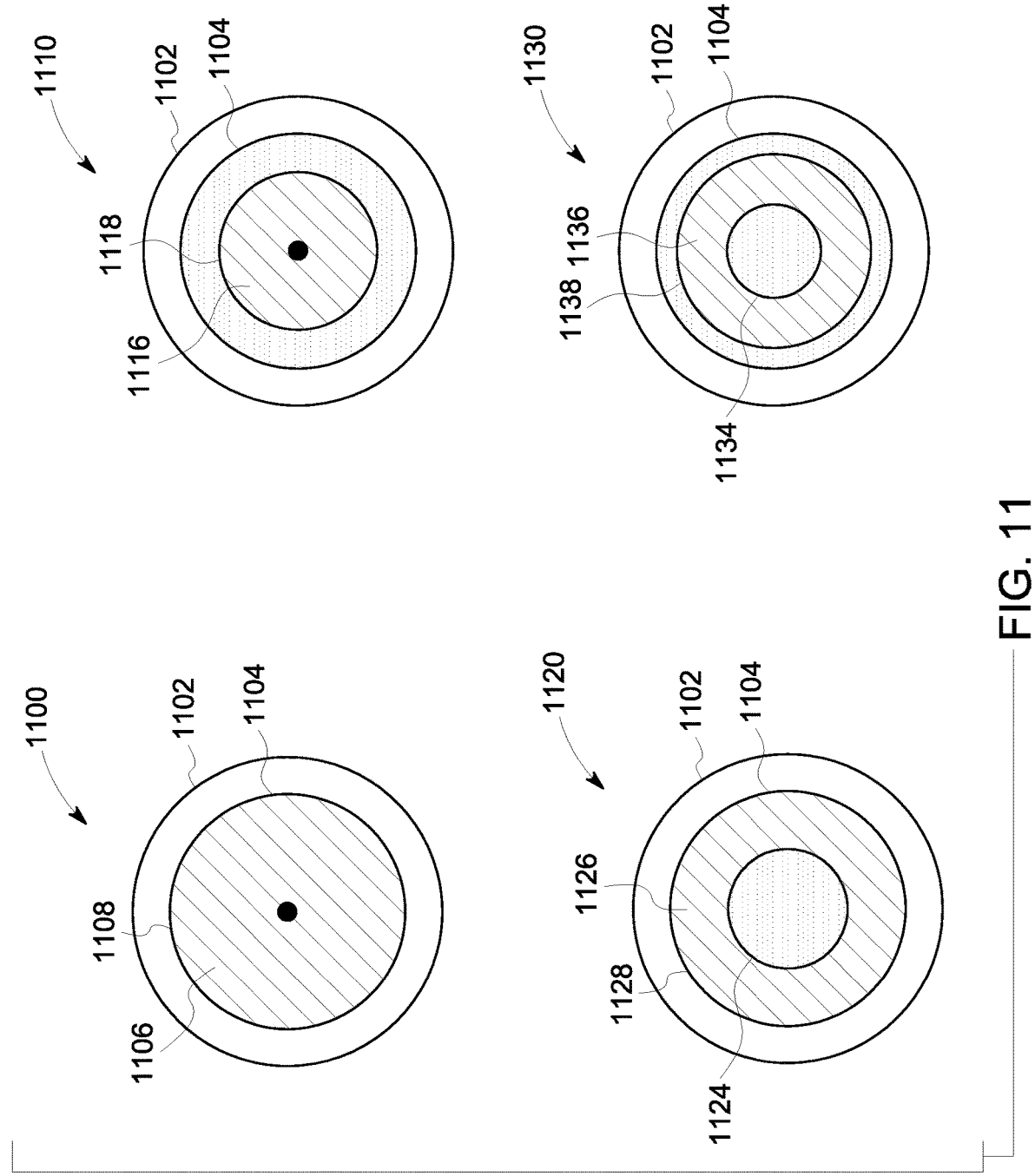
FIG. 11 illustrates cross-sectional views of different embodiments of enhancement structures.

FIG. 11 illustrates cross-sectional views of different embodiments of enhancement structures. A first enhancement structure 1100 is additively manufactured with a cooling channel 1102 that has an inner diameter 1104. The walls of the cooling channel 1102 and the first enhancement structure 1100 can be formed by additive manufacturing, such as three-dimensional printing. As shown, the cooling channel 1102 has a cylindrical shape with an open interior chamber surrounded by the inner diameter 1104. The first enhancement structure 1100 includes a spiral protrusion 1106 that is disposed within the open interior chamber. The first enhancement structure 1100 has an outer diameter 1108 that is approximately equal to the inner diameter 1104 of the cooling channel 1102. For example, each spiral protrusion may be coupled with an inner surface of the cooling channel 1102. In one or more embodiments, a second enhancement structure 1110 is additively manufactured with the cooling channel 1102 that has the inner diameter 1104. The second enhancement structure 1110 includes a spiral protrusion 1116 having an outer diameter 1118 that is less than the inner diameter 1104 of the cooling channel 1102. For example, the cooling fluid may flow around the spiral protrusion 1116 and along the space between the outer diameter 1118 of the structure 1110 and the inner diameter 1104 of the cooling channel 1102.

Like the first enhancement structure 1100, a third enhancement structure 1120 includes a spiral protrusion 1126 having an outer diameter 1128 that is approximately equal to the inner diameter 1104 of the cooling channel 1102. One difference between the first and third enhancement structures 1100, 1120 is that the third enhancement structure 1120 has an inner diameter 1124 that is greater than an inner diameter of the first enhancement structure 1100. For example, the cooling fluid may flow around the spiral protrusion 1126 and within the inner diameter 1124 of the third enhancement structure 1120.

Like the second enhancement structure 1110, a fourth enhancement structure 1130 includes a spiral protrusion 1136 having an outer diameter 1138 that is less than the inner diameter 1104 of the cooling channel 1102. One difference between the second and fourth enhancement structures 1110, 1130 is that the spiral protrusion 1136 of the fourth enhancement structure 1130 also includes an inner diameter 1134 that is greater than an inner diameter of the second enhancement structure 1110. For example, the cooling fluid may flow around the spiral protrusion 1136, along the space between the outer diameter 1138 and the inner diameter 1104 of the cooling channel 1102, and within the inner diameter 1134 of the fourth enhancement structure 1130. Optionally, one or more of the enhancement structures 1100, 1110, 1120, 1130 may have common or varying diameters along a length of each of the structures 1100, 1110, 1120, 1130. Optionally, one or more of the structures 1100, 1110, 1120, 1130 may have any alternative cross-sectional shape and/or size relative to the cooling channel 1102.

The enhancement structures 1100, 1110, 1120, 1130 illustrated in FIG. 11 have a shape that is substantially round and concentric with the cooling channel 1102. In one or more alternative embodiments, the cooling channel 102 and/or one or more of the structures 1100, 1110, 1120, 1130 may have any alternative cross-sectional shape. For example, one of the structures may be substantially circular, but may not be concentric with the cooling channel. Optionally, one of the structures may be concentric with the cooling channel, but may have an alternative cross-sectional shape (e.g., oval, quadrilateral, or the like). Optionally, the cooling channel may have any quadrilateral shape, and the structure may have a substantially circular cross-sectional shape that may not be centered about a center axis of the cooling channel. Optionally, the spiral protrusion of one or more enhancement structures may have any varying shape and/or size along a length of the cooling channel (not shown). Optionally, the cooling channel and the enhancement structure may have any alternative shape, size, or orientation relative to the other of the cooling channel or the enhancement structure.

Figure 12:
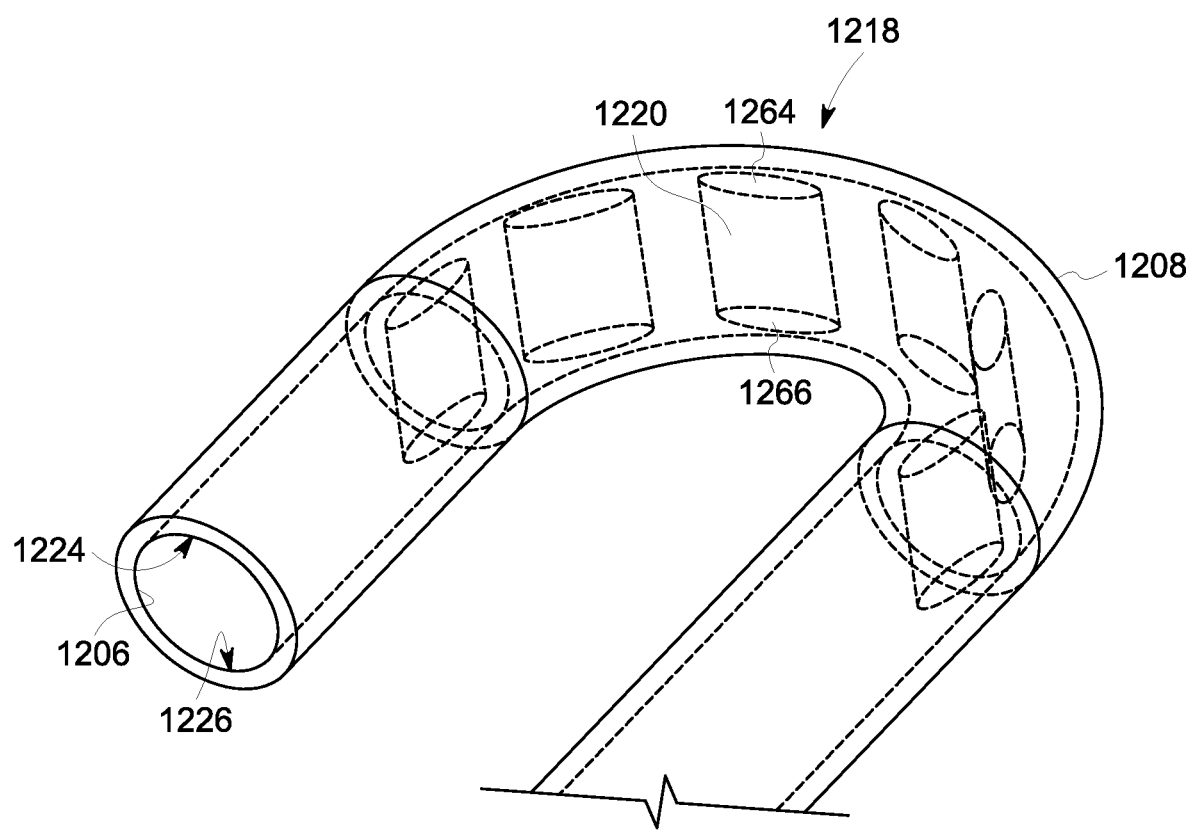
FIG. 12 illustrates a cross-sectional view of one embodiment of another enhancement structure of one of the conduits shown in FIG. 8.

FIG. 12 illustrates a cross-sectional view of an embodiment of an enhancement structure 1218 coupled with a cooling channel 1208. The enhancement structure 1218 includes plural fins 1220 that are additively manufactured with the cooling channel 1208. Each of the fins 1220 includes a first end 1264 that is coupled with or disposed proximate a first side 1224 of an inner surface 1206 of the cooling channel 1208, and a second end 1266 that is coupled with or disposed proximate a second side 1226 of the inner surface 1206. Additionally or alternatively, the fins 1220 may be alternatively coupled with the first side 1224 then the second side 1226 of the cooling channel 1208 such that the cooling fluid may flow over and under, or from one side to another side, and around each fin 1220 of the enhancement structure 1218 as the cooling fluid moves within the cooling channel 1208. For example, a first end of a first fin may be coupled with the first side 1224 but the second end of the first fin may not be coupled with the second side 1226, and a subsequent second fin (e.g., in the direction of flow of the cooling fluid) may have a second end of the second fin coupled with the second side 1226 but the first end of the second fin may not be coupled with the first side 1224.

In the illustrated embodiment, each of the fins 1220 have a uniform shape and size relative to each other fin 1220, however one or more of the fins 1220 may have any alternative unique shape, size, orientation, or the like. For example, the fins 1220 extend substantially vertically between the first and second sides 1224, 1226 of the cooling channel 1208, however, one or more fins 1220 may alternatively extend substantially horizontally or in any alternative direction within the cooling channel 1208. The fins 1220 increase the surface area over which the cooling fluid moves within the cooling channel 1208 to increase an amount of thermal energy that may be conducted from a heat source (not shown) outside of the cooling channel 1208.

In some additive manufacturing processes, cooling channels, conduits, or the like, and the planar and/or non-planar hermetic walls forming the cooling channels are created using uniform parameters. For example, the additive manufacturing process may be used to create walls of the cooling channels having a uniform thickness (e.g., within manufacturing tolerances) and/or uniform spiral protrusions or other enhancement structures in the cooling channels and/or conduits. In one embodiment of the inventive subject matter described herein, however, the cooling channels and/or enhancement structures can be formed with non-uniform thicknesses and/or sizes. For example, one or more operating parameters of the additive manufacturing process can be varied with respect to time and/or location during the manufacture of the cooling channels, cooling chambers, conduits, enhancement structures, or the like. The operating parameters can include the size of particles used to create the additive-manufactured body, the power of a laser light used to weld the particles together, the duration at which the laser light is exposed to the particles, or the like.

Making the thicknesses and/or sizes of the walls or other features of the cooling channels, conduits, cooling chambers, enhancement structures, or the like, have a non-uniform distribution in a body of a cooling assembly can improve the efficiency by which the cooling assembly transfers thermal energy. The non-uniform thicknesses and/or sizes can allow for cooling fluid (e.g., working fluid) to more easily move through the three-dimensional shape of the channels, chambers, conduits, or the like, of the cooling assembly.

In one or more embodiments of the subject matter described herein, a cooling assembly includes a body configured to be placed into thermal contact with a heat source and one or more non-planar, hermetic walls disposed within the body. The one or more non-planar hermetic walls extending around, enclosing, and defining a cooling channel configured to carry cooling fluid through the body such that the cooling fluid contacts internal surfaces of the cooling channel inside the body. The assembly including one or more enhancement structures disposed within the body and coupled with the one or more non-planar hermetic walls. The one or more enhancement structures shaped to change a flow path of the cooling fluid as the cooling fluid moves within the cooling channel and shaped to increase a surface area contacted by the cooling fluid within the cooling channel.

Optionally, the assembly includes an array of conduits fluidly coupled with the cooling channel. The array of conduits extending in one or more orthogonal dimensions within the body. The cooling fluid is configured to move within the array of conduits.

Optionally, the cooling channel directs the cooling fluid in one or more different directions within the body.

Optionally, the cooling fluid is configured to change between a liquid phase and a gas phase as the one or more enhancement structures change the flow path of the cooling fluid as the cooling fluid moves within the cooling channel.

Optionally, the one or more enhancement structures are one or more of surface area enhancement structures or thermal energy enhancement structures.

Optionally, the one or more enhancement structures include one or more protrusions disposed inside the cooling channel.

Optionally, the one or more protrusions include a spiral protrusion helically wrapped and extending away from the internal surfaces of the cooling channel about a center axis of the cooling channel.

Optionally, the one or more enhancement structures include one or more fins. Each fin includes a first end coupled with a first internal surface of the cooling channel and a second end coupled with a second internal surface of the cooling channel.

Optionally, the cooling fluid is configured to flow one or more of over or under the one or more fins.

Optionally, the one or more enhancement structures and the one or more non-planar hermetic walls defining the cooling channel are additively manufactured within the body.

Optionally, the cooling channel is a first cooling channel. The cooling assembly also including one or more non-planar, hermetic walls defining a second cooling channel fluidly coupled with the first cooling channel. The first cooling channel is configured to direct the cooling fluid from the first cooling channel to the second cooling channel through one or more impingement holes.

Optionally, the cooling channel is thermally coupled with at least one cooling chamber disposed inside the body. The at least one cooling chamber contains a working fluid within the at least one cooling chamber.

Optionally, the at least one cooling chamber is configured to transfer thermal energy from the working fluid to the cooling fluid inside the cooling channel.

In one or more embodiments of the subject matter described herein, a cooling assembly includes a body placed into thermal contact with a heat source, and one or more non-planar, hermetic walls disposed within the body. The one or more non-planar hermetic walls extending around, enclosing, and defining a cooling channel configured to carry cooling fluid through the body such that the cooling fluid contacts internal surfaces of the cooling channel inside the body. The assembly also includes one or more enhancement structures disposed within the body and coupled with the one or more non-planar, hermetic walls. The one or more enhancement structures shaped to change a flow path of the cooling fluid as the cooling fluid moves within the cooling channel and shaped to increase a surface area contacted by the cooling fluid within the cooling channel. The one or more enhancement structures and the one or more non-planar, hermetic walls defining the cooling channel are additively manufactured inside the body.

Optionally, the one or more enhancement structures are one or more of surface area enhancement structures or thermal energy enhancement structures.

Optionally, the assembly also includes an array of conduits fluidly coupled with the cooling channel. The array of conduits extends in one or more orthogonal dimensions within the body. The cooling fluid is configured to move within the array of conduits.

Optionally, the cooling channel is configured to direct the cooling fluid in one or more different directions inside the body.

Optionally, the cooling fluid is configured to change between a liquid phase and a gas phase as the one or more enhancement structures change the flow path of the cooling fluid as the cooling fluid moves within the cooling channel.

Optionally, the cooling channel is thermally coupled with at least one cooling chamber disposed inside the body. The at least one cooling chamber contains a working fluid within the at least one cooling chamber.

In one or more embodiments of the subject matter described herein, an additively manufactured cooling assembly includes a body placed into thermal contact with a heat source, and one or more non-planar hermetic walls disposed within the body. The one or more non-planar, hermetic walls extending around, enclosing, and defining a cooling channel configured to carry cooling fluid through the body such that the cooling fluid contacts internal surfaces of the cooling channel inside the body. The assembly also includes one or more enhancement structures disposed within the body and coupled with the one or more non-planar, hermetic walls. The one or more enhancement structures shaped to change a flow path of the cooling fluid as the cooling fluid moves within the cooling channel and shaped to increase a surface area contacted by the cooling fluid within the cooling channel.

As used herein, an element or step recited in the singular and proceeded with the word "a" or "an" does not exclude plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The above description is illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A cooling assembly comprising:
   a body configured to be placed into thermal contact with a heat source;

one or more non-planar, hermetic walls disposed within the body, the one or more non-planar hermetic walls extending around, enclosing, and defining a first cooling channel configured to carry cooling fluid through the body such that the cooling fluid contacts internal surfaces of the first cooling channel inside the body;

one or more non-planar, hermetic walls defining a second cooling channel fluidly coupled with the first cooling channel; and one or more enhancement structures disposed within the body and shaped to change a flow path of the cooling fluid as the cooling fluid moves within one or more of the first or second cooling channels and shaped to increase a surface area contacted by the cooling fluid within the one or more of the first or second cooling channels, wherein the one or more enhancement structures and the one or more non-planar, hermetic walls are a unitary embodiment, the one or more enhancement structures extending a distance away from the one or more non-planar, hermetic walls, and wherein the first cooling channel is configured to direct the cooling fluid from the first cooling channel to the second cooling channel through one or more impingement holes.

2. The cooling assembly of claim 1, further comprising an array of conduits fluidly coupled with one or more of the first or second cooling channels, the array of conduits extending in one or more orthogonal dimensions within the body, wherein the cooling fluid is configured to move within the array of conduits.

3. The cooling assembly of claim 1, wherein the first and second cooling channels are configured to direct the cooling fluid in one or more different directions within the body.

4. The cooling assembly of claim 1, wherein the cooling fluid is configured to change between a liquid phase and a gas phase as the one or more enhancement structures change the flow path of the cooling fluid as the cooling fluid moves within the first and second cooling channels.

5. The cooling assembly of claim 1, wherein the one or more enhancement structures are one or more of surface area enhancement structures or thermal energy enhancement structures.

6. The cooling assembly of claim 1, wherein the one or more enhancement structures include one or more protrusions disposed inside one or more of the first or second cooling channels.

7. The cooling assembly of claim 6, wherein the one or more protrusions include a spiral protrusion helically wrapped and extending away from the internal surfaces of the one or more of the first or second cooling channels about a center axis of the one or more of the first or second cooling channels.

8. The cooling assembly of claim 1, wherein the one or more enhancement structures include one or more fins, each fin including a first end coupled with a first internal surface of the one or more of the first or second cooling channels and a second end coupled with a second internal surface of the one or more of the first or second cooling channels.

9. The cooling assembly of claim 8, wherein the cooling fluid is configured to flow one or more of over or under the one or more fins.

10. The cooling assembly of claim 1, wherein the one or more enhancement structures are configured to change one or more characteristics of the cooling fluid as the cooling fluid moves through the body within the first and second cooling channels.

11. The cooling assembly of claim 1, wherein one or more of the the first or second cooling channels are thermally coupled with at least one cooling chamber disposed inside the body, wherein the at least one cooling chamber contains a working fluid within the at least one cooling chamber.

12. The cooling assembly of claim 11, wherein the at least one cooling chamber is configured to transfer thermal energy from the working fluid to the cooling fluid inside the one or more of the first or second cooling channels.

13. A cooling assembly comprising:
a body configured to be placed into thermal contact with a heat source;

one or more non-planar, hermetic walls disposed within the body, the one or more non-planar hermetic walls extending around, enclosing, and defining a first cooling channel configured to carry cooling fluid through the body such that the cooling fluid contacts internal surfaces of the first cooling channel inside the body;

one or more non-planar, hermetic walls defining a second cooling channel fluidly coupled with the first cooling channel, wherein the first cooling channel is configured to direct the cooling fluid from the first cooling channel to the second cooling channel through one or more impingement holes; and one or more enhancement structures disposed within the body and shaped to change a flow path of the cooling fluid as the cooling fluid moves within one or more of the first or second cooling channels and shaped to increase a surface area contacted by the cooling fluid within the one or more of the first or second cooling channels, wherein the one or more enhancement structures and the one or more non-planar, hermetic walls defining the first and second cooling channels are additively manufactured inside the body such that the one or more enhancement structures and the one or more non-planar, hermetic walls are a unitary embodiment, the one or more enhancement structures extending a distance away from the one or more non-planar, hermetic walls, and wherein the unitary embodiment of the one or more enhancement structures and the one or more non-planar, hermetic walls change one or more of a shape or a size of the first and second cooling channels to change a flow characteristic of the cooling fluid carried through the body.

14. The cooling assembly of claim 13, wherein the one or more enhancement structures are one or more of surface area enhancement structures or thermal energy enhancement structures.

15. The cooling assembly of claim 13, further comprising an array of conduits fluidly coupled with one or more of the first or second cooling channels, the array of conduits extending in one or more orthogonal dimensions within the body, wherein the cooling fluid is configured to move within the array of conduits.

16. The cooling assembly of claim 13, wherein the first and second cooling channels are configured to direct the cooling fluid in one or more different directions inside the body.

17. The cooling assembly of claim 13, wherein the cooling fluid is configured to change between a liquid phase and a gas phase as the one or more enhancement structures change the flow path of the cooling fluid as the cooling fluid moves within one or more of the first or second cooling channels.

18. The cooling assembly of claim 13, wherein one or more of the first or second cooling channels are thermally coupled with at least one cooling chamber disposed inside the body, wherein the at least one cooling chamber contains a working fluid within the at least one cooling chamber.

19. An additively manufactured cooling assembly comprising:
- a body configured to be placed into thermal contact with a heat source;
- one or more non-planar, hermetic walls disposed within the body, the one or more non-planar hermetic walls extending around, enclosing, and defining plural cooling channels configured to carry cooling fluid through the body such that the cooling fluid contacts internal surfaces of the cooling channels inside the body, one of the plural cooling channels fluidly coupled with one or more other cooling channels via one or more impingement holes; and
- one or more enhancement structures disposed within the body and coupled with the one or more non-planar, hermetic walls, the one or more enhancement structures shaped to change a flow path of the cooling fluid as the cooling fluid moves within the cooling channels and shaped to increase a surface area contacted by the cooling fluid within the cooling channels.

* * * * *